(12) United States Patent
Koyama et al.

(10) Patent No.: US 10,196,740 B2
(45) Date of Patent: Feb. 5, 2019

(54) LAMINATE AND METHOD OF MANUFACTURING THE SAME, AND GAS BARRIER FILM AND METHOD OF MANUFACTURING THE SAME

(71) Applicant: TOPPAN PRINTING CO., LTD., Tokyo (JP)

(72) Inventors: Hiroshi Koyama, Tokyo (JP); Mitsuru Kano, Tokyo (JP); Jin Sato, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 0 days.

(21) Appl. No.: 15/417,510

(22) Filed: Jan. 27, 2017

(65) Prior Publication Data

US 2017/0137941 A1     May 18, 2017

Related U.S. Application Data

(63) Continuation of application No. PCT/JP2015/071494, filed on Jul. 29, 2015.

(30) Foreign Application Priority Data

Jul. 29, 2014     (JP) ................................ 2014-153921

(51) Int. Cl.
    *C23C 16/40*     (2006.01)
    *C23C 16/455*     (2006.01)
    *B32B 7/10*     (2006.01)
    *B32B 9/00*     (2006.01)
    (Continued)

(52) U.S. Cl.
    CPC .......... *C23C 16/45553* (2013.01); *B32B 7/10* (2013.01); *B32B 9/00* (2013.01);
    (Continued)

(58) Field of Classification Search
    CPC ... B32B 27/06; B32B 7/10; B32B 2307/7246; B32B 9/00; B32B 15/08; C23C 14/10;
    (Continued)

(56) References Cited

U.S. PATENT DOCUMENTS

2009/0000517 A1     1/2009    Kishimoto
2014/0242365 A1     8/2014    De Vries et al.

FOREIGN PATENT DOCUMENTS

JP     2004-535514 A     11/2004
JP     2007-516347 A     6/2007
    (Continued)

OTHER PUBLICATIONS

International Search Report issued in International Patent Application No. PCT/JP2015/071494 dated Oct. 13, 2015.
(Continued)

*Primary Examiner* — David Sample
*Assistant Examiner* — Elizabeth Collister
(74) *Attorney, Agent, or Firm* — Foley & Lardner LLP

(57) ABSTRACT

A laminate of the present invention includes: a substrate made of a polymer material; an undercoat layer disposed on at least part of an outer surface of the substrate and made up of an inorganic material containing an inorganic substance having a functional group; and an atomic layer deposition film disposed so as to cover an outer surface of the undercoat layer and containing a precursor which is a deposition raw material such that the precursor located on the outer surface of the undercoat layer and the functional group of the inorganic substance are bound to each other.

11 Claims, 2 Drawing Sheets

(51) Int. Cl.
    *B32B 27/06*     (2006.01)
    *C23C 14/10*     (2006.01)
    *C23C 14/20*     (2006.01)
    *C23C 16/02*     (2006.01)

(52) U.S. Cl.
    CPC ............ *B32B 27/06* (2013.01); *C23C 14/10* (2013.01); *C23C 14/20* (2013.01); *C23C 16/0245* (2013.01); *C23C 16/0272* (2013.01); *C23C 16/403* (2013.01); *C23C 16/45555* (2013.01)

(58) Field of Classification Search
    CPC . C23C 14/20; C23C 16/0245; C23C 16/0272; C23C 16/403; C23C 16/401; C23C 16/402; C23C 16/45553; C23C 16/45555; C23C 16/45523; C23C 16/12; C23C 16/34
    USPC ............... 428/448, 457, 458, 461, 469, 702
    See application file for complete search history.

(56) References Cited

FOREIGN PATENT DOCUMENTS

| | | |
|---|---|---|
| JP | 2011-241421 | 12/2011 |
| WO | WO-2013/015412 A1 | 1/2013 |
| WO | WO-2013/050741 | 4/2013 |

OTHER PUBLICATIONS

Extended European Search Report issued in EP Patent Application No. 15827371.4 dated Nov. 15, 2017.

LAMINATE AND METHOD OF MANUFACTURING THE SAME, AND GAS BARRIER FILM AND METHOD OF MANUFACTURING THE SAME

CROSS-REFERENCE TO RELATED PATENT APPLICATIONS

This application is a continuation application filed under 35 U.S.C. § 111(a) claiming the benefit under 35 U.S.C. §§ 120 and 365(c) of International Application No. PCT/JP2015/071494 filed on Jul. 29, 2015, which is based upon and claims the benefit of priority of Japanese Patent Application No. 2014-153921, filed on Jul. 29, 2014, the entireties of which are hereby incorporated by reference.

TECHNICAL FIELD

The present invention relates to a laminate and a method of manufacturing the same, and a gas barrier film and a method of manufacturing the same. More specifically, the present invention relates to a laminate including a substrate made of a polymer and a method of manufacturing the laminate, and a gas barrier film including the laminate and a method of manufacturing the gas barrier film.

BACKGROUND

Methods for forming a thin film on the surface of a substance using a gaseous phase in which a substance is allowed to move at an atomic or molecular level in a similar manner to gas are known. These methods include chemical vapor deposition (CVD) (hereinafter, referred to as "CVD") and physical vapor deposition (PVD) (hereinafter, referred to as "PVD").

PVD includes, for example, vacuum vapor deposition and sputtering. Sputtering, which enables production of a high-quality thin film with a uniform film quality and thickness, has been widely applied to display devices such as liquid crystal displays.

CVD is a method of growing a solid thin film by introducing raw material gas into a vacuum chamber and decomposing or reacting one or two types of gas on a substrate by means of heat energy.

Here, a plasma or catalyst reaction is commonly used in order to promote the reaction during film formation or decrease the reaction temperature.

CVD using plasma reaction is called plasma enhanced CVD (PECVD), and CVD using catalyst reaction is called Cat-CVD.

These CVD methods can reduce deficiencies in film formation, and are applied to a manufacturing process of semiconductor devices (for example, formation of a gate insulating film) or the like.

In recent years, atomic layer deposition (ALD) (hereinafter, referred to as "ALD") has attracted attention.

ALD is a method in which a substance adsorbed on a surface is deposited layer by layer at an atomic level by means of chemical reaction on the surface. ALD is classified as a type of CVD.

A typical CVD (a generally known CVD) is a method of growing a thin film by reacting a single gas or a plurality of gases simultaneously on a substrate. In contrast, ALD is a specific method of deposition for growing thin films at an atomic level layer by layer by alternately using a highly active gas or precursor (such as tri-methyl aluminum (TMA); hereinafter, "first precursor") and a reactive gas (in ALD, also called a precursor; hereinafter, "second precursor") by means of adsorption on the substance surface and subsequent chemical reaction.

Specifically, ALD processes are conducted as follows.

First, when precursors have been adsorbed onto the substrate to form only one layer, unreacted precursors are purged by using a so-called self-limiting effect (a phenomenon during a surface adsorption on the substrate that gas is no longer adsorbed onto a surface when the surface is covered by a certain type of gas) (first step).

Then, a reactive gas is introduced into a chamber to oxidize or reduce the above precursors to thereby form only one layer of a thin film having a desired composition, and after that, the reactive gas is purged (second step).

In ALD, the above first and second steps are taken as one cycle, which is repeated to grow thin films on the substrate.

Accordingly, ALD grows thin films in two dimensions. Further, compared with the conventional vacuum vapor deposition or sputtering as well as the conventional CVD, ALD is characterized in reducing deficiencies in film deposition.

Accordingly, ALD is expected to be widely applied to the packaging field for foods, pharmaceutical products, or the like, or the electronics field.

PTL 1 discloses a product comprising a substrate made of a material selected from the group consisting of a plastic and a glass, and a gas transmission barrier deposited on the substrate by atomic layer vapor deposition.

Further, PTL 1 discloses that a light emitting polymer is mounted on a plastic substrate having optical transparency and atomic layer vapor deposition is performed on a top and side surfaces of the light emitting polymer by means of ALD (top coating), thereby achieving reduction in coating deficiencies and drastically reducing gas permeability for the thickness of several tens of nanometers.

Formation of the atomic layer deposition film on the substrate made of a polymer material by means of ALD is considered probably different in the form of growth from formation on a substrate made of an inorganic crystal such as Si wafer.

When an atomic layer deposition film is formed on the substrate by means of ALD by using the substrate of Si wafer having an oxidation treated surface, adsorption sites for precursors which serve as raw materials of the atomic layer deposition film are present at substantially the same density as the lattice of crystal, and growth of the film proceeds in a two-dimensional growth mode.

On the other hand, when an atomic layer deposition film is formed on the substrate made of a polymer material by means of ALD, it is known that adsorption sites for precursors which serve as raw materials of the atomic layer deposition film are present at a low distribution density, which results in the adsorption sites growing in three dimensions around nucleuses, which are the precursors adsorbed separated from each other, which causes contact between the adjacent nucleuses, leading to formation of a continuous layer.

Further, depending on the state of the substrate made of a polymer material and the ALD process conditions, growth into a columnar shape from the outer surface of the substrate in a direction perpendicular to the outer surface of the substrate is likely to occur.

That is, when the atomic layer deposition film is formed on the substrate made of a polymer material by means of ALD, there is a risk that gas may pass through gaps between a plurality of columnar structures that constitute the atomic layer deposition film from the outer surface of the atomic layer deposition film toward the substrate.

In other words, when the atomic layer deposition film is formed on the substrate made of a polymer material by means of ALD, there is a risk that the atomic layer deposition film will not have desired gas barrier properties.

A technique for solving the above problem is disclosed in PTL 2.

PTL 2 discloses formation of an undercoat layer containing an organic polymer by using an organic binder containing an inorganic substance on a substrate (outer surface of the substrate) made of a polymer material.

CITATION LIST

Patent Literature

[PTL 1] JP-A-2007-516347
[PTL 2] WO 2013/015412

SUMMARY OF THE INVENTION

Technical Problem

The present inventors have studied the technique disclosed in PTL 2 as a preliminary study for the present invention. However, it has been found in the technique disclosed in PTL 2 that the adsorption sites are difficult to form at a sufficient density since a large number of adsorption sites are difficult to form in a region in which an organic polymer is disposed on the outer surface of the substrate made of a polymer material, although a large number of adsorption sites can be formed in a region in which an inorganic substance, which has more functional groups than an organic polymer (organic substance) has, is disposed.

The present inventors assumed that there were two reasons for failure in providing a sufficient number of adsorption sites. One of the reasons is that a free volume which is present in the organic polymer causes an insufficient density of the adsorption sites and two-dimensional growth does not start until the free volume is filled with the precursors.

The other of the reasons is that, for coating of the organic polymer, a step is necessary in which the organic polymer is dissolved in solution for coating and then mounted on the deposition apparatus of ALD, which causes contamination of the surface with substances in air or deactivation of highly reactive functional groups during this step.

In particular, there is a problem that sufficient gas barrier properties are not obtained when the atomic layer deposition film is thin.

The present invention has an object to provide a laminate that improves barrier properties of an atomic layer deposition film by providing adsorption sites for precursors of the atomic layer deposition film at a sufficient density on the outer surface, on which the atomic layer deposition film is disposed, of an undercoat layer disposed on the substrate made of a polymer material and a method of manufacturing thereof, and a gas barrier film and a method of manufacturing thereof.

Solution to Problem

In order to solve the above problem, a laminate according to a first aspect of the present invention includes: a substrate made of a polymer material; an undercoat layer disposed on at least part of the outer surface of the substrate and made up of an inorganic material containing an inorganic substance having a functional group; and an atomic layer deposition film disposed so as to cover an outer surface of the undercoat layer and containing a precursor which is a deposition raw material such that the precursor located on the outer surface of the undercoat layer and the functional group of the inorganic substance are bound to each other.

In the laminate according to the first aspect of the present invention, when a water vapor transmission rate of the substrate is defined as 100%, the water vapor transmission rate of a two-layer laminate which is made up of the substrate and the undercoat layer may be in the range of 2% or more and 100% or less.

In the laminate according to the first aspect of the present invention, the inorganic substance may be one of inorganic oxide, inorganic nitride and a mixture of inorganic oxide and inorganic nitride.

In the laminate according to the first aspect of the present invention, the undercoat layer may contain $SiO_X$ with X in the range of 1.0 or more and 2.0 or less.

In the laminate according to the first aspect of the present invention, the undercoat layer may contain Sn.

In the laminate according to the first aspect of the present invention, the atomic layer deposition film may have a thickness in the range of 0.5 nm or more and 200 nm or less.

A gas barrier film according to a second aspect of the present invention includes the laminate according to first aspect, wherein the substrate which constitutes the laminate is a film-shaped substrate.

In the gas barrier film according to the second aspect of the present invention, the laminate may have a water vapor transmission rate of 0.1 $g/(m^2 \cdot day)$ or less.

A method of manufacturing a laminate according to a third aspect of the present invention includes: forming an undercoat layer by using an inorganic material containing an inorganic substance having a functional group on at least part of an outer surface of a substrate made of a polymer material placed in a vacuum chamber (step of forming undercoat layer); and forming an atomic layer deposition film by supplying a precursor onto an outer surface of the undercoat layer so that the precursor which serves as a deposition raw material is bound to the functional group located on the outer surface of the undercoat layer (step of forming atomic layer deposition film).

In the method of manufacturing a laminate according to the third aspect of the present invention, in the step of forming the undercoat layer, the undercoat layer is formed such that, when a water vapor transmission rate of the substrate is defined as 100%, the water vapor transmission rate of a two-layer laminate which is made up of the substrate and the undercoat layer is in the range of 2% or more and 100% or less.

In the method of manufacturing a laminate according to the third aspect of the present invention, the inorganic substance may be one of an inorganic oxide, inorganic nitride and a mixture of inorganic oxide and inorganic nitride.

In the method of manufacturing a laminate according to the third aspect of the present invention, in the step of forming the undercoat layer, the undercoat layer may be formed to contain $SiO_X$ with X in the range of 1.0 or more and 2.0 or less.

In the method of manufacturing a laminate according to the third aspect of the present invention, in the step of forming the undercoat layer, the undercoat layer may be formed to contain Sn.

In the method of manufacturing a laminate according to the third aspect of the present invention, in the step of forming the atomic layer deposition film, the atomic layer deposition film may be formed to have a thickness in the range of 0.5 nm or more and 200 nm or less.

A method of manufacturing a gas barrier film according to a fourth aspect of the present invention includes the method of manufacturing a laminate according to the third aspect, wherein the substrate may be a film-shaped substrate.

Advantageous Effects of Invention

According to the aspects of the present invention, adsorption sites for precursors of the atomic layer deposition film can be provided at a sufficient density on the outer surface, on which the atomic layer deposition film is disposed, of the undercoat layer disposed on the substrate made of a polymer material, thereby improving barrier properties of an atomic layer deposition film.

DESCRIPTION OF REPRESENTATIVE EMBODIMENTS

With reference to the accompanying drawings, embodiments of the present invention will be described in detail. The drawings used for the following description are provided for describing a configuration of embodiments of the present invention, and the size, thickness, dimensions or the like of the illustrated components may not be different from those of the actual laminate. Also, it is understood that the invention is not necessarily limited to the following description of the embodiment.

Embodiment

<Overview of Embodiment>

Figure 1:
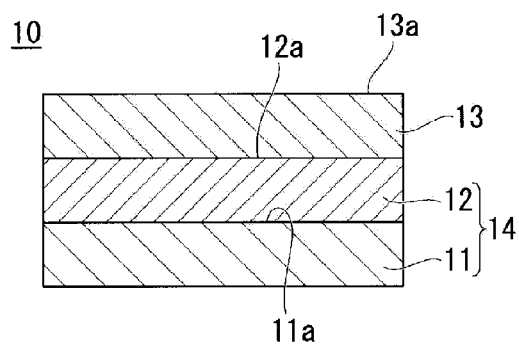
FIG. 1 is a cross sectional view which schematically shows a laminate according to an embodiment of the present invention.

FIG. 1 is a cross sectional view which schematically shows a laminate according to an embodiment of the present invention. In this embodiment, the description will be made by means of an example which uses a film-shaped substrate as a substrate 11 that constitutes a laminate 10.

The laminate 10 according to an embodiment of the present invention includes an undercoat layer 12 between the substrate 11 made of a polymer material and an atomic layer deposition film 13, and the undercoat layer 12 contains an inorganic substance having a functional group which is a binding site for a precursor which is a deposition raw material of the atomic layer deposition film 13 and composed of an inorganic material.

Accordingly, a large number of adsorption sites (not shown) to which the above precursors contained in the atomic layer deposition film 13 are bound is provided on the outer surface 12a of the undercoat layer 12 at a high density compared with the undercoat layer made of an organic binder and inorganic substance as disclosed in PTL 2.

The precursors bound to the adsorption sites in the undercoat layer 12 are crosslinked to each other. Accordingly, the atomic layer deposition film 13 is formed in two dimensions in a plane direction of the undercoat layer 12 (a direction parallel to the outer surface 12a).

As a result, the atomic layer deposition film 13 is less likely to have a gap through which gas passes in a thickness direction of the laminate 10. This enables the atomic layer deposition film 13 having high gas barrier properties to be obtained.

Moreover, an adhesive layer (for example, a resin layer containing an organic polymer), which is not shown in the figure, may be disposed between the substrate 11 and the undercoat layer 12. The adhesive layer disposed between the substrate 11 and the undercoat layer 12 can improve adhesive strength between the substrate 11 and the undercoat layer 12.

<Approach to the Present Invention>

Laminates having an atomic layer deposition film manufactured by atomic layer deposition (ALD) are currently commercially produced as electronics substrates such as those for thin-film wireless EL, displays, semiconductor memories (dynamic random access memory (DRAM)), and glass substrates or silicon substrates.

A substrate used for a laminate of an embodiment of the present invention is a substrate made of a polymer material. However, the processes of atomic layer deposition (ALD) for such a substrate have not been researched in detail.

Therefore, the inventors of the present invention attempted an approach to the laminate of the present invention while examining the growth process of the atomic layer deposition film on the substrate made of a polymer material on the assumption that the growth of the atomic layer deposition film for forming the atomic layer deposition film on the outer surface of the substrate made of a polymer material is the same as the growth for forming the atomic layer deposition film on electronics substrates.

In general, an atomic layer deposition film is considered to grow in two dimensions when the atomic layer deposition film is formed on electronics substrates.

However, when an atomic layer deposition film is formed on the substrate made of a polymer material (for example, polyethylene terephthalate, PET), the atomic layer deposition film does not actually grow in two dimensions.

In other words, in formation of thin film of the atomic layer deposition by means of the ALD on the outer surface of the substrate made of a polymer material, there is a risk that two-dimensional growth originally expected in the ALD may fail.

Possible reasons for failure in two dimensional growth are "the density of the adsorption sites" or "the positions of adsorption sites" on the outer surface (a surface on which the atomic layer deposition film is formed) of the substrate made of a polymer material.

If the atomic layer deposition film has too small a thickness, the atomic layer deposition film does not sufficiently exhibit barrier properties. Therefore, the thickness of the atomic layer deposition film is required to be 3 nm or more (in other words, the layer has a thickness of 30 molecules or more).

The first reason of the failure, that is, the density of the adsorption sites for precursors which serve as a deposition raw material for the atomic layer deposition film, can be considered as follows.

In the first step in the ALD, a gaseous precursor (for example, tri-methyl aluminum (TMA) or a metal-containing precursor such as $TiCl_4$) is chemically adsorbed onto a surface of the substrate made of a polymer material (hereinafter, simply referred to as a "substrate").

Here, the reactivity between the precursor and the functional group of the inorganic substance contained in the substrate, and the density of the functional groups seem to have a significant effect on the chemical adsorption.

If the density of the functional groups is low, the adsorption sites for precursors are disposed as separated from each other.

Thus, when the adsorption sites are disposed separated from each other, the atomic layer deposition film grows in three dimensions around the adsorption sites as nucleuses.

That is, if the density of the adsorption sites is low, the atomic layer deposition film expands in three dimensions for precursors, and the precursors are sparsely absorbed onto a site such as OH. Consequently, the atomic layer deposition film grows around the isolated nucleus into a columnar shape.

Then, the second reason of the failure, that is, the positions of adsorption sites (in other words, diffusion of precursor) can be considered as follows.

In general, polymer materials are made up of a mix of a crystalline region and an amorphous region. The amorphous region has a space called a free volume, in which polymer chains are not present. Consequently, gas may diffuse or penetrate through the space.

Moreover, gaseous precursors also pass through the space of the free volume until they are absorbed onto the adsorption site.

As described above, in formation of the atomic layer deposition film on the outer surface (surface) of the substrate made of a polymer material by means of ALD, the precursors, which are deposition raw materials for the atomic layer deposition film, are diffused from the outer surface (surface) to the inside of the substrate, and absorbed onto the functional groups of the inorganic substances which are sparsely present in three dimensions. Thus, the adsorption sites become the nucleuses for the atomic layer deposition film.

Since the above nucleuses are present in three dimensions, the growth proceeds in a three dimensional mode until the adjacent nucleuses come into contact with each other to thereby form a continuous layer. After that, the growth proceeds in a two dimensional mode.

In other words, when the atomic layer deposition film is formed on the outer surface of the substrate made of a polymer material by means of ALD, a period of time from the start of the forming process of the atomic layer deposition film to the formation of a dense film by two-dimensional growth becomes long. If the thickness of the atomic layer deposition film is reduced, a dense portion by two-dimensional growth in the atomic layer deposition film becomes extremely small.

In the atomic layer deposition film having the above configuration, gas barrier properties of the atomic layer deposition film become lower, and gas passes through the gap formed in the atomic layer deposition film.

In addition, since the gas passes through the free volume space, a laminate with high gas barrier properties is difficult to obtain.

Therefore, the inventors of the present invention have conceived the idea of providing an undercoat layer containing an inorganic substance on the outer surface of the substrate made of a polymer material, in order to increase the density of the adsorption sites for precursors of the deposition raw material for the atomic layer deposition film and to prevent diffusion of precursors into the polymer substrate.

That is, in order to provide the adsorption sites for precursors of the deposition raw material for the atomic layer deposition film on the outer surface (surface) of the substrate made of a polymer material in two dimensions at a high density, an undercoat layer containing an inorganic substance is disposed on the outer surface (surface) of the substrate made of a polymer material prior to the ALD process.

Thus, the gas containing precursors is prevented from passing through the undercoat layer by providing the undercoat layer containing the inorganic substance on the outer surface (surface) of the substrate made of a polymer material.

<Laminate>

With reference to FIG. 1, the laminate 10 according to the present embodiment includes the substrate 11, the undercoat layer 12 and the atomic layer deposition film 13.

<Substrate>

The substrate 11 is made of a polymer material. The substrate 11 has an outer surface 11a on which the undercoat layer 12 is formed.

Figure 2:
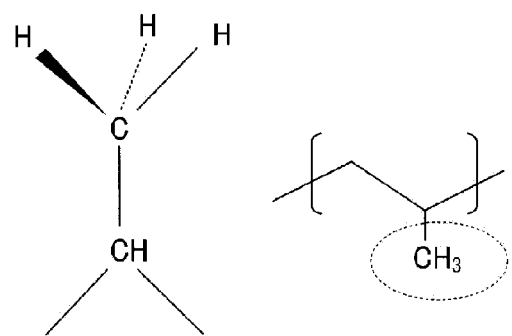
FIG. 2 is a view which shows a structural formula of a methyl group, which is an example of a functional group of the organic polymer which constitutes the substrate.
Figure 3:
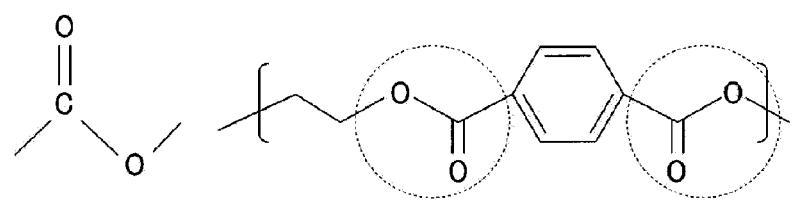
FIG. 3 is a view which shows a structural formula of an ester group, which is an example of a functional group of the organic polymer which constitutes the substrate.

FIG. 2 is a view which shows a structural formula of a methyl group, which is an example of a functional group of the organic polymer which constitutes the substrate. FIG. 3 is a view which shows a structural formula of an ester group, which is an example of a functional group of the organic polymer which constitutes the substrate.

The polymer material which constitutes the substrate 11 may be a polymer material having only a hydrocarbon, for example, polyethylene (PE), polypropylene (PP) having a methyl group with poor nucleophilicity (see FIG. 2) or polystyrene (PS).

Further, the polymer material which constitutes the substrate 11 may also be polyethylene terephthalate (PET) having a nucleophilic ester group (see FIG. 3), a polymer material containing the O atom of polyethylene naphthalate (PEN), the N atom of Nylon, polyimide (PI) or the like, the S atom of polyethersulfone or the like.

The substrate 11 may be a substrate which is in a film shape (hereinafter, "film-shaped substrate"), or a substrate which is not in a film shape.

When the laminate 10 is used for a barrier film, the substrate 11 may be, for example, a film-shaped substrate.

In this case, the thickness of the substrate 11 (film-shaped substrate) is preferably in the range from 12 to 300 μm, more preferably in the range from 50 to 100 μm.

<Undercoat Layer>

The undercoat layer 12 is disposed so as to cover the outer surface 11a of the substrate 11. The undercoat layer 12 is formed of only an inorganic material containing an inorganic substance having a functional group.

That is, many inorganic substances are provided on the outer surface 12a (surface) of the undercoat layer 12 compared with the outer surface (surface) of the undercoat layer formed by using an organic binder containing an inorganic substance disclosed in PTL 2.

The inorganic substance includes many functional groups (a portion which provides the deposition raw material of the atomic layer deposition film 13 and to which precursors contained in the atomic layer deposition film 13 are bound) compared with the organic substance.

Accordingly, a large number of adsorption sites (not shown) to which the above precursors contained in the atomic layer deposition film 13 are bound is provided on the outer surface 12a (surface) of the undercoat layer 12 at a high density compared with the outer surface (surface) of the undercoat layer disclosed in PTL 2.

As a result, a period of time from the start of forming process of the atomic layer deposition film 13 to the formation of dense film by two-dimensional growth becomes shorter than the conventional period of time (in other words, it is difficult for the above precursors to enter the space of the free volume). Accordingly, a dense portion produced by two-dimensional growth in the atomic layer deposition film can be increased even if the thickness of the atomic layer deposition film 13 is reduced (for example, in the range of 0.5 nm or more and 200 nm or less). Therefore, even if the thickness of the atomic layer deposition film 13 is reduced, sufficient gas barrier properties can be obtained.

Further, since the atomic layer deposition film 13 has sufficient gas barrier properties, gas is prevented from passing through the substrate 11 via the atomic layer deposition film 13 (in other words, gas is prevented from moving into a space of the free volume formed in the substrate 11), thereby achieving the laminate 10 having high gas barrier properties.

The inorganic substance contained in the undercoat layer 12 may be, for example, one of inorganic oxide, inorganic nitride and a mixture of inorganic oxide and inorganic nitride.

Examples of the inorganic oxide include $SiO_X$ ($1.0 \leq X \leq 2.0$), $SiSnO_X$ ($1.0 \leq X \leq 2.0$), $SiO_X Nv$ ($1.0 \leq X \leq 2.0$), $AlO_X$ ($1.0 \leq X \leq 1.5$), $ZnSnO_X$ ($1.0 \leq X \leq 2.0$), ITO, ZnO, IZO, ZnS, MgO, and $SnO_X$ ($1.0 \leq X \leq 2.0$).

The value X in $SiO_X$ is limited to $1.0 \leq X \leq 2.0$ due to current manufacturing limitations. Moreover, the value X in $SiO_X$ is preferably close to 2.0. When the value X in $SiO_X$ is close to 2.0, the density of the adsorption sites can be increased and the transparency of film can be increased.

Further, the undercoat layer 12 containing $SiO_X$ may contain, for example, Sn. Thus, when the undercoat layer 12 contains $SiO_X$ and Sn (that is, $SiSnO_X$ ($1.0 \leq X \leq 2.0$)), the density of the adsorption sites on the outer surface 12a of the undercoat layer 12 can be increased.

Examples of the inorganic nitride include $SiN_x$ ($1.0 \leq X \leq 1.3$).

When a water vapor transmission rate of the substrate 11 is defined as 100%, the water vapor transmission rate of the two-layer laminate 14 made up of the substrate 11 and the undercoat layer 12 may be, for example, 2% or more.

When the water vapor transmission rate of the two-layer laminate 14 is less than 2% to the water vapor transmission rate of the substrate 11 of 100%, materials available for the undercoat layer 12 are limited. Further, when the water vapor transmission rate of the two-layer laminate 14 is less than 2%, the thickness of the undercoat layer 12 needs to be increased. However, increasing the thickness of the undercoat layer 12 leads to cracks or deficiencies in the undercoat layer 12.

Therefore, the substrate 11 having the water vapor transmission rate of 2% can increase the degree of freedom in selecting the material for the undercoat layer 12 and decrease the thickness of the undercoat layer 12, thereby reducing the risk of cracks or deficiencies in the undercoat layer 12.

Furthermore, the density of the adsorption sites can be increased by applying plasma etching or hydrolyzation on the outer surface 12a of the undercoat layer 12. In this case, an inorganic oxide having M-O-M decyclized, for example, by plasma etching to form an M-OH group is preferably selected for the inorganic oxide contained in the undercoat layer 12.

Although the undercoat layer 12 is disposed so as to cover the outer surface 11a of the substrate 11 in the example described in FIG. 1, the configuration is not limited to that shown in FIG. 1. Any configuration is possible as long as the undercoat layer 12 is disposed to cover at least part of the outer surface 11a of the substrate 11.

Further, although the undercoat layer 12 is disposed such that the outer surface 11a of the substrate 11 and the undercoat layer 12 are in contact with each other in the example described in FIG. 1, an adhesive layer (for example, a resin layer containing an organic polymer), which is not shown, may be disposed between the substrate 11 and the undercoat layer 12.

Thus, the adhesive layer disposed between the substrate 11 and the undercoat layer 12 can enhance adhesion strength between the substrate 11 and the undercoat layer 12.

<Atomic Layer Deposition Film>

The atomic layer deposition film 13 is disposed so as to cover the outer surface 12a of the undercoat layer 12.

The atomic layer deposition film 13 contains precursors (for example, tri-methyl aluminum (TMA) or a metal-containing precursor such as $TiCl_4$), which is a deposition raw material for the atomic layer deposition film 13. In the atomic layer deposition film 13, precursors located on the outer surface 12a of the undercoat layer 12 are bound to the functional groups of the inorganic substance.

The atomic layer deposition film 13 may be, for example, an inorganic oxide film containing inorganic oxide such as $AlO_X$ ($1.0 \leq X \leq 1.5$), $TiO_X$ ($1.0 \leq X \leq 2.0$), $SiO_X$ ($1.0 \leq X \leq 2.0$), $ZnO_X$ ($1.0 \leq X \leq 2.0$), $SnO_X$ ($1.0 \leq X \leq 2.0$), or a nitride film or an oxynitride film containing these inorganic oxides.

Alternatively, the atomic layer deposition film 13 may be, for example, an oxide film, nitride film or oxynitride film containing other elements (such as Zr and Hf).

Considering the water vapor barrier properties, durability, and cost, a film containing at least one of the elements Al, Si, and Ti (for example, the film described above) is preferably used for the atomic layer deposition film 13. Using a film containing such an element for the atomic layer deposition film 13 can achieve high water vapor barrier properties and high durability, and reduce the cost.

Preferably, the thickness of the atomic layer deposition film 13 is, for example, in the range of 0.5 nm or more and 200 nm or less. When the thickness of the atomic layer deposition film 13 is less than 0.5 nm, the atomic layer deposition film 13 does not have sufficient water vapor barrier properties from a view of manufacturing technology. On the other hand, when the thickness of the atomic layer deposition film 13 is over 200 nm, the cost and time for film deposition increase, which is not desirable.

Accordingly, when the thickness of the atomic layer deposition film 13 is in the range of 0.5 nm or more and 200 nm or less, the atomic layer deposition film 13 with sufficient water vapor barrier properties can be obtained in a short period of time.

According to a laminate of the present embodiment which includes the substrate 11 made of a polymer material, an undercoat layer 12 disposed on at least part of the outer surface 11a of the substrate 11 and made up of an inorganic material containing an inorganic substance having a functional group, and an atomic layer deposition film 13 disposed so as to cover the outer surface 12a of the undercoat layer 12 and containing a precursor which is a deposition raw material such that the precursor located on the outer surface 12a of the undercoat layer 12 and the functional group of the inorganic substance are bound to each other, a period of time from the start of the forming process of the atomic layer deposition film 13 to the formation of dense film by two dimensional growth becomes shorter than the conventional period of time (in other words, it is difficult for the above precursors to enter a space of the free volume). Accordingly, a dense portion by two-dimensional growth in the atomic layer deposition film can be increased even if the thickness of the atomic layer deposition film 13 is reduced (for example, in a range of 0.5 nm or more and 200 nm or less), and thus sufficient gas barrier properties can be obtained even if the thickness of the atomic layer deposition film 13 is reduced.

Further, since the atomic layer deposition film 13 has sufficient gas barrier properties, gas is prevented from passing through the substrate 11 via the atomic layer deposition film 13 (in other words, gas is prevented from moving into a space of the free volume formed in the substrate 11), thereby achieving the laminate 10 having high gas barrier properties.

<Gas Barrier Film>

The gas barrier film (not shown) includes the laminate 10 shown in FIG. 1, and the substrate 11 which constitutes the laminate 10 is a film-shaped substrate. The gas barrier film (not shown) may be formed only by the laminate 10, or may be provided with a protective layer for protecting the atomic layer deposition film 13 (specifically, for example, a layer containing the same inorganic substance as that of the undercoat layer 12, a layer containing an organic substance, or a structure on which a plastic film is laminated) disposed on the outer surface 13a of the atomic layer deposition film 13 which is disposed on the outermost layer of the laminate 10.

The gas barrier film (not shown) having the above configuration is used in various fields such as food packaging, pharmaceutical products, electronics, and agricultural materials.

The water vapor transmission rate of the laminate 10 is preferably, for example, 0.1 g/(m$^2$·day) or less. When the water vapor transmission rate of the laminate 10 is more than 0.1 g/(m$^2$·day), the laminate 10 can be used for food packaging, but cannot protect electronics which may degenerate on exposure to a slight amount of water. Accordingly, for use as a protective layer for electronics, which is one of the applications of the present invention, the laminate 10 should have the water vapor transmission rate of 0.1 g/(m$^2$·day) or less.

According to the gas barrier film (not shown) having the above configuration, the same effect as that of the laminate 10 described above can be obtained.

<Method of Manufacturing Laminate>

With reference to FIG. 1, a method of manufacturing the laminate 10 according to the present embodiment will be described.

First, the undercoat layer 12 is formed on at least part of the outer surface 11a of the substrate 11 made of a polymer material (step of forming undercoat layer).

The undercoat layer 12 may be formed by various methods such as PVD (for example, induction heating, resistance heating, electron beam vapor deposition or sputtering), CVD (for example, heat CVD, plasma CVD or optical CVD) and the like.

In the step of forming the undercoat layer, the undercoat layer 12 is preferably formed to contain SiO$_X$ with X in the range of, for example, 1.0 or more and 2.0 or less.

The X in SiO$_X$ is limited to 1.0 or more and 2.0 or less due to current manufacturing limitations. Moreover, the X in SiOX$_X$ is preferably close to 2.0. When the X in SiO$_X$ is close to 2.0, the density of the adsorption sites can be increased.

Further, in the step of forming the undercoat layer, the undercoat layer 12 is preferably formed to contain SiO$_X$ and Sn (that is, SiSnO$_X$ (1.0≤X≤2.0)). Thus, when the undercoat layer 12 contains SiO$_X$ and Sn (that is, SiSnO$_X$ (1.0≤X≤2.0)), the density of the adsorption sites on the outer surface 12a of the undercoat layer 12 can be increased.

Here, a specific method of manufacturing the undercoat layer 12 will be described using an example of forming the undercoat layer 12 containing SiO$_X$.

First, the substrate 11 on which the undercoat layer 12 is not formed is fixed to a stage in a vacuum chamber (not shown).

Then, a pressure (pre-deposition pressure) in the vacuum chamber is set to, for example, 4×10$^{-3}$ Pa. Here, a temperature in the vacuum chamber is set to, for example, 30 degrees.

Then, after the pressure (pre-deposition pressure) in the vacuum chamber is set to, for example, 2×10$^{-2}$ Pa, the undercoat layer 12 containing SiO$_X$ (1.0≤X≤2.0) is formed on at least part of the outer surface 11a of the substrate 11 by means of electron beam vapor deposition.

When an adhesive layer (not shown) is formed on the outer surface 11a of the substrate 11, the adhesive layer is formed prior to the above step of forming the undercoat layer.

Specifically, the adhesive layer is formed by applying a coating liquid (liquid of base material for the adhesive layer) on the outer surface 11a of the substrate 11 by using a wire bar, and then drying the liquid.

The coating liquid can be prepared, for example, by dissolving an organic polymer which is a copolymer of poly (methacrylic acid-2-hydroxyethyl) and polymethacrylic acid methyl with the poly (methacrylic acid-2-hydroxyethyl) contained in the copolymer at the percentage of 35 mol % in a mixture solution of methyl ethyl ketone and cyclohexanone.

The thickness of the adhesive layer may be set as appropriate, for example, in the range between 1 to 500 nm.

The adhesive layer is not an essential component for the present invention, and may be provided as necessary.

Then, precursors are supplied onto the outer surface 12a of the undercoat layer 12 so that the precursors which are deposition raw materials are bound to the functional groups of the inorganic substance located on the outer surface 12a of the undercoat layer 12 to thereby form the atomic layer deposition film 13 that covers the outer surface 12a of the undercoat layer 12 (step of forming atomic layer deposition film).

That is, in the step of forming the atomic layer deposition film, the atomic layer deposition film 13 is formed by means of atomic layer deposition (ALD). Thus, the laminate 10 is manufactured.

Specifically, when an Al$_2$O$_3$ layer is formed as the atomic layer deposition film 13, the following method can be used.

First, the substrate 11 on which the undercoat layer 12 and the adhesive layer are formed is fixed to a stage in a deposition chamber (not shown) of an atomic layer deposition film forming apparatus (not shown).

Then, gas serving as a reactive gas and a discharge gas (for example, at least one of $O_2$ and $N_2$) is introduced into the deposition chamber to supply the gas serving as a reactive gas and a discharge gas onto the outer surface 12a of the undercoat layer 12 (Step 1).

The pressure inside the deposition chamber may be set as appropriate, for example, in the range between 10 and 50 Pa.

Further, a power supply for plasma gas excitation may be, for example, a power supply at 13.56 MHz.

Then, plasma discharge is performed in the inductively coupled plasma (ICP) mode in the deposition chamber (Step 2).

An output power supply for plasma discharge may be, for example, 250 watts.

After the above plasma discharge, the deposition chamber is purged with gas (Step 3). Gas used for the gas purge may be, for example, $O_2$, $N_2$ or the like. Further, a reaction temperature of the gas purge may be, for example, 90° C.

Then, tri-methyl aluminum (TMA), which is a deposition raw material (precursor) and a purge gas (for example, $N_2$ and $O_2$) are simultaneously supplied into the deposition chamber (Step 4).

Then, the gas serving as a reactive gas and a discharge gas (for example, $O_2$) is supplied into the deposition chamber (Step 5). The pressure inside the deposition chamber may be a predetermined pressure, for example, in the range between 10 and 50 Pa.

Subsequently, plasma discharge is conducted in the deposition chamber in the inductively coupled plasma (ICP) mode (Step 6) to form an $Al_2O_3$ layer of a single-atom layer (part of the atomic layer deposition film 13) on the outer surface 12a of the undercoat layer 12.

A power supply for plasma gas excitation used in this process may be, for example, a power supply with 13.56 MHz.

The processes described above from Step 1 to Step 6 are taken as one cycle, and the cycle is repeated for a plurality of times to form the atomic layer deposition film 13 made of the $Al_2O_3$ layer.

In the step of forming the atomic layer deposition film, the atomic layer deposition film 13 is preferably formed to have a thickness in the range of, for example, 0.5 nm or more and 200 nm or less.

When the thickness of the atomic layer deposition film 13 is less than 0.5 nm, the atomic layer deposition film 13 does not have sufficient water vapor barrier properties from a view of manufacturing technology. When the thickness of the atomic layer deposition film 13 is over 200 nm, the cost and time for film deposition increase, which is not desirable.

Accordingly, when the thickness of the atomic layer deposition film 13 is in the range of 0.5 nm or more and 200 nm or less, the atomic layer deposition film 13 with sufficient water vapor barrier properties can be obtained in a short period of time.

Moreover, subsequent to the step of forming the undercoat layer, the outer surface 12a of the undercoat layer 12 may be processed with a surface treatment (for example, plasma treatment (plasma etching treatment), corona treatment or alkali treatment) so as to increase the density of the adsorption sites.

According to a method of manufacturing a laminate of the present embodiment which includes the step of forming the undercoat layer for forming the undercoat layer 12 by using an inorganic material containing an inorganic substance having a functional group on at least part of the outer surface 11a of the substrate 11 made of a polymer material placed in the vacuum chamber (not shown), and the step of forming the atomic layer deposition film for forming the atomic layer deposition film 13 by supplying the precursors onto the outer surface 12a of the undercoat layer 12 so that the precursors which are deposition raw materials are bound to the functional groups of the inorganic substance located on the outer surface 12a of the undercoat layer 12, a period of time from the start of forming process of the atomic layer deposition film 13 to the formation of dense film by two dimensional growth becomes shorter than the conventional period of time (in other words, it is difficult for the above precursors to enter a space of the free volume). Accordingly, a dense portion produced by two-dimensional growth in the atomic layer deposition film can be increased even if the thickness of the atomic layer deposition film 13 is reduced (for example, in a range of 0.5 nm or more and 200 nm or less), and thus sufficient gas barrier properties can be obtained even if the thickness of the atomic layer deposition film 13 is reduced.

Further, since the atomic layer deposition film 13 has sufficient gas barrier properties, gas is prevented from passing through the substrate 11 via the atomic layer deposition film 13 (in other words, gas is prevented from moving into a space of the free volume formed in the substrate 11), thereby achieving the laminate 10 having high gas barrier properties.

<Method of Manufacturing Gas Barrier Film>

The method of manufacturing the gas barrier film (not shown) varies depending on the configuration of the gas barrier film. When the gas barrier film has the same configuration as that of the laminate 10 shown in FIG. 1, the gas barrier film can be manufactured by the same method as that of the aforementioned laminate 10.

Further, when the gas barrier film is configured to further include a protective layer (not shown) for protecting a top surface 13a of the atomic layer deposition film 13 in addition to the configuration of the laminate 10 shown in FIG. 1, the gas barrier film can be manufactured by the same method as that of the aforementioned laminate 10 except for including the step of forming the protective layer (specifically, for example, a layer containing the same inorganic substance as that of the undercoat layer 12, a layer containing an organic substance, or a structure on which a plastic film is laminated) subsequent to the step of forming the atomic layer deposition film.

The protective layer may be formed, for example, by means of PVD or CVD if containing an inorganic substance, or may be formed by means of bar coating or spin coating if containing an organic substance.

Further, in manufacturing of a gas barrier film, a film-shaped substrate is used for the substrate 11.

According to the method for manufacturing a gas barrier film (not shown), the same effect as that of the method for manufacturing the laminate 10 described above can be obtained.

Test examples, examples and comparative examples of the present invention will be described. However, the present invention is not limited in any way to the examples below.

Test Example 1

<Manufacturing of Laminate of Example 1>

With reference to FIG. 1, a method of manufacturing a laminate of Example 1 (hereinafter, referred to as a "laminate 10-1") will be described.

First, a coating liquid was applied on the outer surface 11a of the substrate 11 made of a polyethylene naphthalate (PEN) film with a thickness of 50 μm (Q51 (model number), manufactured by Teijin DuPont Films Limited) by using a wire bar to thereby form an adhesive layer (not shown) with a dry thickness of 0.1 μm.

Here, the coating liquid was prepared by dissolving an organic polymer which is a copolymer of poly (methacrylic acid-2-hydroxyethyl) and polymethacrylic acid methyl with the poly (methacrylic acid-2-hydroxyethyl) contained in the copolymer at the percentage of 35 mol % in a mixture solution of methyl ethyl ketone and cyclohexanone.

Then, a $SiO_{1.6}$ layer (layer with a composition of $SiO_{1.6}$) having a thickness of 10 nm was formed as the undercoat layer 12 on the outer surface (surface) of the adhesive layer by means of electron beam vapor deposition. The pre-deposition pressure was $4\times10^{-3}$ Pa, and a pressure during deposition was $2\times10^{-2}$ Pa.

Then, an $Al_2O_3$ layer with a thickness of 2 nm was formed as the atomic layer deposition film 13 on the outer surface 12a of the undercoat layer 12 by means of ALD.

Specifically, the $Al_2O_3$ layer with a thickness of 2 nm was formed by the following steps.

First, $O_2$ was supplied as a gas serving as a reactive gas and a discharge gas onto the outer surface 12a of the undercoat layer 12 which is housed in the deposition chamber (Step 1). The pressure inside the deposition chamber was 40 Pa. A power supply at 13.56 MHz was used as a power supply for plasma gas excitation. Plasma discharge in the ICP mode was conducted for 60 seconds (Step 2).

The output power supply for this plasma discharge was 250 watts.

After the plasma discharge, the deposition chamber was purged with gas (Step 3). In the gas purge, $O_2$ and $N_2$ were supplied as a purge gas for ten seconds. The reaction temperature was 90° C.

Then, tri-methyl aluminum (TMA), which is a deposition raw material (precursor) and a purge gas (for example, $N_2$ and $O_2$) were simultaneously supplied into the deposition chamber (Step 4).

Then, $O_2$ was supplied as gas serving as a reactive gas and a discharge gas into the deposition chamber (Step 5). The pressure inside the deposition chamber was 40 Pa.

Subsequently, plasma discharge was conducted in the deposition chamber in the ICP mode (Step 6) to form an $Al_2O_3$ layer of a single-atom layer (part of the atomic layer deposition film 13) on the outer surface 12a on the undercoat layer 12. A power supply at 13.56 MHz was used for the power supply for plasma gas excitation.

The processes described above from Step 1 to Step 6 were taken as one cycle, and the cycle was repeated for 15 times to form an $Al_2O_3$ layer (atomic layer deposition film 13) with a thickness of 2 nm.

Thus, the laminate 10-1 of Example 1 was produced.

<Manufacturing of Laminate of Example 2>

With reference to FIG. 1, a method of manufacturing a laminate of Example 2 (hereinafter, referred to as a "laminate 10-2") will be described.

In Example 2, the laminate 10-2 of Example 2 was manufactured by the same method as that of the laminate 10-1 except for the thickness of the undercoat layer 12 which constitutes the laminate 10-1 of Example 1 being changed to 20 nm.

<Manufacturing of Laminate of Example 3>

With reference to FIG. 1, a method of manufacturing a laminate of Example 3 (hereinafter, referred to as a "laminate 10-3") will be described.

In Example 3, the laminate 10-3 of Example 3 was manufactured by the same method as that of the laminate 10-2 except for the composition of the undercoat layer 12 which constitutes the laminate 10-2 of Example 2 being changed to $SiO_2$.

<Manufacturing of Laminate of Example 4>

With reference to FIG. 1, a method of manufacturing a laminate of Example 4 (hereinafter, referred to as a "laminate 10-4") will be described.

In Example 4, the laminate 10-4 of Example 4 was manufactured by the same method as that of the laminate 10-2 except for the composition of the undercoat layer 12 which constitutes the laminate 10-3 of Example 3 being changed to $SiSnO_{1.6}$.

In Example 4, in the step of forming the undercoat layer, the undercoat layer 12 having the composition of $SiSnO_{1.6}$ was formed by mixing Sn in the material of the deposition source ($SiO_{1.6}$) prior to deposition.

<Manufacturing of Laminate of Example 5>

With reference to FIG. 1, a method of manufacturing a laminate of Example 5 (hereinafter, referred to as a "laminate 10-5") will be described.

In Example 5, the laminate 10-5 of Example 5 was manufactured by the same method as that of the laminate 10-1 except for the thickness of the undercoat layer 12 which constitutes the laminate 10-1 of Example 1 being changed to 30 nm.

<Manufacturing of Laminate of Example 6>

With reference to FIG. 1, a method of manufacturing a laminate of Example 6 (hereinafter, referred to as a "laminate 10-6") will be described.

In Example 6, the laminate 10-6 of Example 6 was manufactured by the same method as that of the laminate 10-2 of Example 2 except for eliminating the step of forming an adhesive layer (in other words, the undercoat layer 12 was formed directly on the outer surface 11a of the substrate 11).

<Manufacturing of Laminate of Comparative Example>

In Comparative example, an $Al_2O_3$ layer with a thickness of 2 nm was formed as the atomic layer deposition film 13 directly on the outer surface 11a of the substrate 11 made of a polyethylene naphthalate (PEN) film with a thickness of 50 μm (Q51 (model number), manufactured by Teijin DuPont Films Limited) by the same method as Example 1 (ALD) without performing the step of forming an adhesive layer and an undercoat layer 12 (see FIG. 1) as performed Example 1.

Thus, the laminate of Comparative example (hereinafter, "laminate A") was manufactured.

<Measurement of Water Vapor Transmission Rate of Laminates 10-1 to 10-6 of Examples 1 to 6 and Laminate A of Comparative Example>

For evaluation of water vapor barrier properties of laminates 10-1 to 10-6 of Examples 1 to 6 and laminate A of Comparative example, the water vapor transmission rate (WVTR) was measured in an atmosphere of 40° C./90% RH by using a water vapor transmission rate measurement apparatus (MOCON Permatran (registered trademark), manufactured by MOCON, Inc.).

The water vapor transmission rate was measured for the water vapor transmission rate (WVTR) of the structure (laminate) before an overcoat layer was formed and the water vapor transmission rate (WVTR) of the structure after the overcoat layer was formed.

Furthermore, assuming that the water vapor transmission rate of Comparative example before the overcoat layer was formed is 100%, the water vapor transmission rate of the structure before the overcoat layer was formed (=(water vapor transmission rate of the structure of Examples before the overcoat layer was formed)/3.88) was calculated.

The results are shown in Table 1

TABLE 1

| | | Structure of laminate | | | Water vapor transmission rate (WVTR) of structure before overcoat layer is formed [g/(m² · day)] | Water vapor transmission rate (WVTR) of structure (laminate) after overcoat layer is formed [g/(m² · day)] | Water vapor transmission rate of the structure before overcoat layer is formed, assuming that water vapor transmission rate of comparative example before overcoat layer was formed is 100% |
|---|---|---|---|---|---|---|---|
| | Adhesive layer | Composition of undercoat layer | Thickness of undercoat layer (nm) | Overcoat layer | | | |
| Example 1 | Yes | $SiO_{1.6}$ | 10 | $Al_2O_3$ layer (2 nm thick) | 0.38 | <0.02 | 9.8 |
| Example 2 | Yes | $SiO_{1.6}$ | 20 | $Al_2O_3$ layer (2 nm thick) | 0.27 | <0.02 | 7.0 |
| Example 3 | Yes | $SiO_2$ | 20 | $Al_2O_3$ layer (2 nm thick) | 3.66 | <0.02 | 94.3 |
| Example 4 | Yes | $SiSnO_{1.6}$ | 20 | $Al_2O_3$ layer (2 nm thick) | 0.14 | <0.02 | 3.6 |
| Example 5 | Yes | $SiO_{1.6}$ | 30 | $Al_2O_3$ layer (2 nm thick) | 0.21 | <0.02 | 5.4 |
| Example 6 | No | $SiO_{1.6}$ | 20 | $Al_2O_3$ layer (2 nm thick) | 0.51 | <0.02 | 13.1 |
| Comparative example | No | — | — | $Al_2O_3$ layer (2 nm thick) | 3.88 | 3.75 | 100.0 |

In Table 1, the structures of the laminates 10-1 to 10-6 of Examples 1 to 6 and the laminate A of Comparative example were also shown.

<Evaluation Results of Laminates 10-1 to 10-6 of Examples 1 to 6 and Laminate A of Comparative Example>

Referring to Table 1, the laminate A which did not have the undercoat layer was observed to have significantly low water vapor barrier properties.

In the laminates 10-1 to 10-5 which had the adhesive layer and the laminate 10-6 which did not have the adhesive layer, the water vapor transmission rate of the structure (laminate) after the overcoat layer was formed was <0.02 [g/(m²·day)], which showed good water vapor barrier properties in spite of the $Al_2O_3$ layer (atomic layer deposition film 13) having a small thickness of 2 nm.

As seen from the above, it was confirmed that good water vapor barrier properties were obtained regardless of whether the adhesive layer was provided or not between the outer surface 11a of the substrate 11 and the undercoat layer 12.

In the laminate 10-4 of Example 4, the water vapor transmission rate of the structure before the overcoat layer was formed was as low as 0.14 [g/(m²·day)]. This seems to be due to Sn contained in the undercoat layer 12.

Test Example 2

<Preparation of Evaluation Sample S1 and Evaluation Test for Adsorption Amount of Precursor>

In Test example 2, an evaluation sample S1 (sample of Example) was prepared by the following technique.

Specifically, first, coating liquid was applied on the outer surface 11a of the substrate 11 made of a polyethylene naphthalate (PEN) film with a thickness of 50 μm (Q51 (model number), manufactured by Teijin DuPont Films Limited) by using a wire bar to thereby form an adhesive layer (not shown) with a dry thickness of 0.1 μm.

Here, the coating liquid was prepared by dissolving an organic polymer which is a copolymer of poly (methacrylic acid-2-hydroxyethyl) and polymethacrylic acid methyl with the poly (methacrylic acid-2-hydroxyethyl) contained in the copolymer at the percentage of 35 mol % in a mixture solution of methyl ethyl ketone and cyclohexanone.

Then, a $SiO_{1.6}$ layer (layer with a composition of $SiO_{1.6}$) having a thickness of 10 nm was formed as the undercoat layer 12 on the outer surface (surface) of the adhesive layer by means of electron beam vapor deposition. The pre-deposition pressure was $4\times10^{-3}$ Pa, and a pressure during deposition was $2\times10^{-2}$ Pa.

Then, evaluation sample S1 was prepared by forming a film having only one layer of the precursor material adsorbed as the atomic layer deposition film 13 on the outer surface 12a of the undercoat layer 12 by means of ALD.

Specifically, the film having only one layer of the precursor material adsorbed was formed by the following steps.

First, $O_2$ was supplied as gas serving as a reactive gas and a discharge gas onto the outer surface 12a of the undercoat layer 12 which is housed in the deposition chamber (Step 1). The pressure inside the deposition chamber was 40 Pa. A power supply at 13.56 MHz was used as a power supply for plasma gas excitation. Plasma discharge in the ICP mode was conducted for 60 seconds (Step 2). The output power supply for this plasma discharge was 250 watts.

After the plasma discharge, the deposition chamber was purged with gas (Step 3). In the gas purge, $O_2$ and $N_2$ were supplied as a purge gas for ten seconds. A reaction temperature of the gas purge was 90° C.

Then, tri-methyl aluminum (TMA), which is a deposition raw material (precursor) and a purge gas (for example, $N_2$ and $O_2$) were simultaneously supplied into the deposition chamber.

The adsorption amount of the precursors bound to the outer surface 12a of the undercoat layer 12 was measured by using an X-ray photoelectron spectroscopy apparatus, JPS-90SXV, manufactured by JEOL Ltd. The X-ray source was MgKa and the integration time was 20. The peak used for quantitation was Al2p (peak position: 73 eV).

Figure 4:
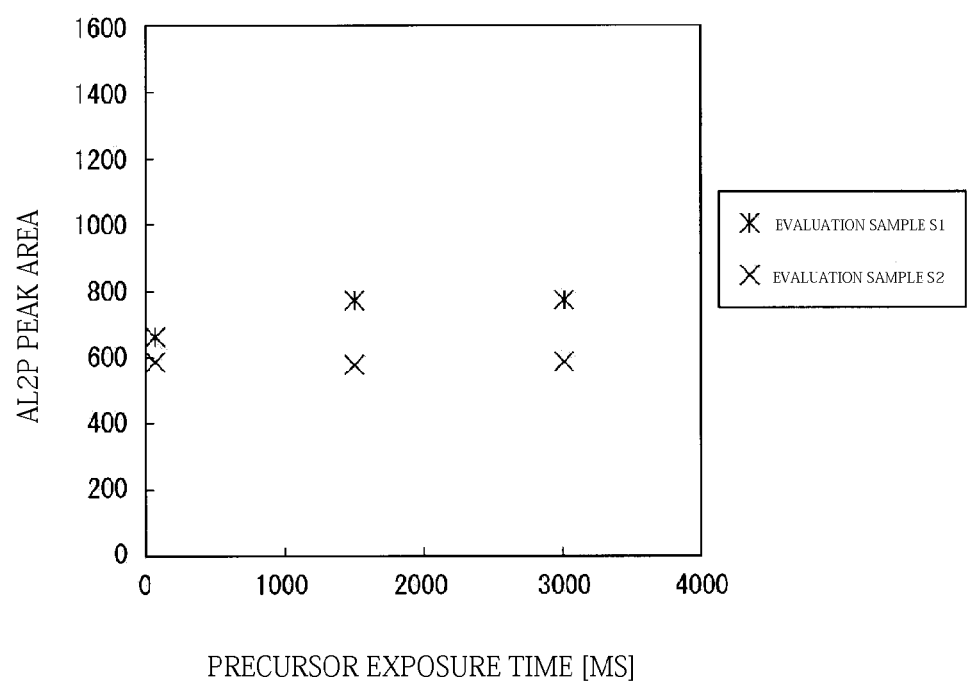
FIG. 4 is a chart (graph) which shows a relationship between the exposure time of precursor of the deposition raw material to the outer surface of the undercoat layer which contains Sn (composition is $SiSnO_{1.6}$) and to the outer surface of the undercoat layer which does not contain Sn (composition is $SiO_{1.6}$) and an Al2p peak area.

FIG. 4 shows the result of evaluation for the change in adsorption amount to different periods of time for exposure of precursor (Step 4). The periods of time for exposure of precursor were 60 ms, 1500 ms, and 3000 ms.

FIG. 4 is a chart (graph) which shows a relationship between the exposure time of precursor of the deposition raw material to the outer surface of the undercoat layer which contains Sn (composition is $SiSnO_{1.6}$) and to the outer surface of the undercoat layer which does not contain Sn (composition is $SiO_{1.6}$) and a peak area of Al2p.

Further, in the X-ray photoelectron spectroscopy (XPS) measurement, an electron in the $2p$ orbital was measured among the electron orbitals of an aluminum (Al) atom. The reason for this is that an electron in the $2p$ orbital is suitable for X-ray usage compared with electrons in the other orbitals of the Al atom. Accordingly, in general, for the measurement of Al atoms by using X-ray photoelectron spectroscopy, the number of electrons in the $2p$ orbital (peak intensity) is typically focused.

<Preparation of Evaluation Sample S2 and Evaluation Test for Adsorption Amount of Precursor>

An evaluation sample S2 (sample of Example) was manufactured by the same method as that of the evaluation sample S1 except for forming a $SiSnO_{1.6}$ layer (composition is $SiSnO_{1.6}$) as the undercoat layer 12 on the outer surface (surface) of the adhesive layer by means of electron beam vapor deposition instead of forming a $SiO_{1.6}$ layer (composition is $SiO_{1.6}$) having a thickness of 10 nm.

The adsorption amount of the precursors bound to the outer surface 12a of the undercoat layer 12 was measured by using the X-ray photoelectron spectroscopy apparatus, JPS-90SXV (hereinafter, referred to as an "XPS") manufactured by JEOL Ltd. by using the same evaluation method and the same evaluation condition as the evaluation of the evaluation sample 1. The periods of time for exposure of precursor were 60 ms, 1500 ms, and 3000 ms. The results are shown in FIG. 4.

<Grounds for Use of XPS for Evaluation of Evaluation Samples S1 and S2>

The following describes how the inventors have decided to use the XPS for evaluation of the evaluation samples S1 and S2. The XPS is an apparatus originally designed to analyze the elements that exist on a surface (specifically, in the depth of approximately a few nm) and determine the quantity of element ratio on the surface.

The present inventors focused on the fact that the peak area detected by the XPS increases as the number of elements existing on the surface increases.

That is, the precursors which are diffused in the substrate passing through the free volume and adsorbed can be disregarded, the adsorption amount of the precursor becomes large as the peak area is large, which shows that the surface has abundant adsorption sites and is excellent.

The surface which has abundant adsorption sites and is excellent means that the surface has little free volume through which the precursors pass, which disturbs the initial growth in ALD. Such a surface can be considered to grow in two dimensions with a smaller number of layers.

In the case of polymer materials such as PET (polyethylene terephthalate) and PEN (polyethylene naphthalate), a free volume of a size that allows the precursor materials to pass through is present. Accordingly, the Al2p peak area increases as the exposure time of the precursors increases.

<Evaluation Results of Evaluation Sample S1 and S2>

Referring to FIG. 4, in the evaluation samples S1 and S2 (sample of Examples), the Al2p peak area remains close to the initial (60 ms) Al2p peak area even if the exposure time of the precursors becomes 1500 ms or 3000 ms, and no significant increase in Al2p peak area was observed.

As seen from this, it seems that the evaluation samples S1 and S2 have little free volume through which the can precursors pass, and so the initial growth in ALD is not disturbed.

INDUSTRIAL APPLICABILITY

The present invention can be applied to a laminate which includes a substrate made of a polymer material, an undercoat layer disposed on the outer surface of the substrate, and an atomic layer deposition film disposed on the outer surface of the undercoat layer, and a method of manufacturing thereof, and a gas barrier film and a method of manufacturing thereof.

REFERENCE SIGNS LIST

10 . . . laminate
11 . . . substrate,
11a, 12a, 13a . . . outer surface,
12 . . . undercoat layer,
13 . . . atomic layer deposition film,
14 . . . two-layer laminate

What is claimed is:

1. A laminate comprising:
a substrate made of a polymer material;
an undercoat layer disposed on at least part of the outer surface of the substrate and made up of an inorganic material containing an inorganic substance having a functional group; and
an atomic layer deposition film disposed so as to cover an outer surface of the undercoat layer and containing a precursor which is a deposition raw material such that the precursor located on the outer surface of the undercoat layer and the functional group of the inorganic substance are bound to each other, wherein the undercoat layer contains $SiSnO_X$ with X being in a range of 1.0 or more and 2.0 or less.

2. The laminate of claim 1, wherein, when a water vapor transmission rate of the substrate is defined as 100%, the water vapor transmission rate of a two-layer laminate which is made up of the substrate and the undercoat layer is in a range of 2% or more and 100% or less.

3. The laminate of claim 1, wherein the inorganic substance is one of inorganic oxide, inorganic nitride and a mixture of inorganic oxide and inorganic nitride.

4. The laminate of claim 1, wherein the atomic layer deposition film has a thickness in a range of 0.5 nm or more and 200 nm or less.

5. A gas barrier film comprising the laminate of claim 1, wherein the substrate which constitutes the laminate is a film-shaped substrate.

6. The gas barrier film of claim 5, wherein the laminate has a water vapor transmission rate of 0.1 $g/(m^2 \cdot day)$ or less.

7. A method of manufacturing a laminate comprising:
forming an undercoat layer by using an inorganic material containing an inorganic substance having a functional group on at least part of an outer surface of a substrate made of a polymer material placed in a vacuum chamber; and
forming an atomic layer deposition film by supplying a precursor onto an outer surface of the undercoat layer so that the precursor which serves as a deposition raw material is bound to the functional group located on the outer surface of the undercoat layer, wherein the undercoat layer contains $SiSnO_X$ with X being in a range of 1.0 or more and 2.0 or less.

8. The method of manufacturing a laminate of claim 7, wherein, in the forming of the undercoat layer, the undercoat layer is formed such that, when a water vapor transmission rate of the substrate is defined as 100%, the water vapor transmission rate of a two-layer laminate which is made up of the substrate and the undercoat layer is in a range of 2% or more and 100% or less.

9. The method of manufacturing a laminate of claim 8, wherein the inorganic substance is one of inorganic oxide, inorganic nitride and a mixture of inorganic oxide and inorganic nitride.

10. The method of manufacturing a laminate of claim 7, wherein, in the forming of the atomic layer deposition film, the atomic layer deposition film is formed to have a thickness in a range of 0.5 nm or more and 200 nm or less.

11. A method of manufacturing a gas barrier film comprising:
   the method of manufacturing a laminate of claim 7, wherein the substrate is a film-shaped substrate.

\* \* \* \* \*